United States Patent
Hara (10) Patent No.: US 11,134,599 B2
(45) Date of Patent: Sep. 28, 2021

(54) COMPONENT MOUNTER AND COMPONENT MOUNTING SYSTEM FOR MOUNTING STACKED COMPONENTS

(71) Applicant: FUJI CORPORATION, Chiryu (JP)

(72) Inventor: Kenji Hara, Kariya (JP)

(73) Assignee: FUJI CORPORATION, Chiryu (JP)

( * ) Notice: Subject to any disclaimer, the term of this patent is extended or adjusted under 35 U.S.C. 154(b) by 453 days.

(21) Appl. No.: 15/743,127

(22) PCT Filed: Jul. 24, 2015

(86) PCT No.: PCT/JP2015/071071
§ 371 (c)(1),
(2) Date: Jan. 9, 2018

(87) PCT Pub. No.: WO2017/017718
PCT Pub. Date: Feb. 2, 2017

(65) Prior Publication Data
US 2019/0104658 A1     Apr. 4, 2019

(51) Int. Cl.
*H05K 13/08* (2006.01)
*H05K 13/04* (2006.01)
*B25J 19/02* (2006.01)

(52) U.S. Cl.
CPC ........ *H05K 13/0812* (2018.08); *B25J 19/023* (2013.01); *H05K 13/0409* (2018.08); *H05K 13/0413* (2013.01); *H05K 13/0419* (2018.08); *H05K 13/0452* (2013.01); *H05K 13/082* (2018.08); *Y10T 29/53174* (2015.01)

(58) Field of Classification Search
CPC ............. H05K 13/0821; H05K 13/082; H05K 13/0409; H05K 13/0419; H05K 13/0413; H05K 13/0452; Y10T 29/53174; Y10T 29/5313; Y10T 29/53; Y10T 29/53191; Y10T 29/53178

USPC .................. 29/700, 729, 739, 740, 741, 743
See application file for complete search history.

(56) References Cited

U.S. PATENT DOCUMENTS

| 7,748,112 B2 * | 7/2010 | Hirata ............... H01L 21/67259 |
| | | 29/833 |
| 2008/0104831 A1 * | 5/2008 | Haji .................. H01L 21/67132 |
| | | 29/833 |

FOREIGN PATENT DOCUMENTS

JP     2010-140932 A     6/2010

OTHER PUBLICATIONS

International Search Report dated Oct. 27, 2015, in PCT/JP2015/071071 filed Jul. 24, 2015.

* cited by examiner

*Primary Examiner* — Peter Dungba Vo
*Assistant Examiner* — Azm A Parvez
(74) *Attorney, Agent, or Firm* — Oblon, McClelland, Maier & Neustadt, L.L.P.

(57) ABSTRACT

During mounting of an upper component on a lower component, after mounting the lower component on a board, the Z-axis position of a suction nozzle tip is detected during mounting of the lower component on the board and memorized as a lower component height, and when mounting the upper component PU, the suction nozzle is lowered at relatively high speed until reaching a specified position that is a distance above the lower component height, and the suction nozzle is lowered at a speed that is slower than the speed after arriving at the specified position until contact with the lower component.

4 Claims, 9 Drawing Sheets

COMPONENT MOUNTER AND COMPONENT MOUNTING SYSTEM FOR MOUNTING STACKED COMPONENTS

TECHNICAL FIELD

The present application relates to a component mounter and a component mounting system.

BACKGROUND ART

There are known conventional component mounters that perform height measurement of a mounting position using a displacement sensor provided on a head, and that perform mounting of a component after correcting the mounting position in the height direction based on the height measurement result. For example, disclosed in patent literature 1 is an item in which, during PoP (Package-on-Package) mounting in which a component mounted on a board (lower component) has another component (upper component) mounted on top of it, height measurement of the lower component is performed by illuminating an upper surface of the lower component that is a measurement target with a laser light and receiving light reflected from the lower component. Patent literature 1: JP-A-2010-140932

SUMMARY

However, with the above component mounter, depending on the material of the upper surface of the lower component that is the measurement target, reflected light may not be able to be received appropriately even if laser light is emitted, such that there are cases in which sufficient measurement accuracy is not obtained. In this case, mounting accuracy of the upper component is worsened, and excessive force may be applied to the lower component and upper component during mounting.

An object of the present disclosure is to improve mounting accuracy of a component when mounting multiple components in a stack on a board.

The present disclosure uses the following means to achieve the above object.

A component mounter of the present disclosure is a component mounter for mounting multiple components in a stack on a board, the component mounter including:
a head including a holding member configured to hold the component;
a raising and lowering device configured to raise and lower the holding member;
a raising and lowering position detector configured to detect a raising and lowering position of the holding member;
a contact detector configured to detect that the component held by the holding member has contacted a mounting target object; and
a controller configured to acquire, when a former component among the multiple components to be stacked on the board has been mounted and contact of the former component to a mounting target object is detected by the contact detector, position information of the former component identified based on the raising and lowering position of the holding member detected by the raising and lowering position detector, and configured to control the head and the raising and lowering device so as to, when mounting a latter component among the multiple components to be stacked on the board, mount the latter component on the former component based on the acquired position information of the former component.

A component mounter of the present disclosure is provided with a head, a raising and lowering device, a raising and lowering position detector, and a contact detector, and, when mounting a former component among the multiple components to be stacked on the board, acquires position information of the former component identified by a raising and lowering position of the holding member detected by the raising and lowering position detector when the contact detector detects that the former component has contacted a mounting target object. Then, when mounting a latter component among the multiple components to be stacked on the board, the component mounter controls the head and the raising and lowering device such that the latter component is mounted on the former component based on the acquired position information of the former component. In this manner, the component mounter, when mounting the former component, by acquiring in advance position information of the former component using the contact detector and the raising and lowering position detector, and performing control such that the latter component is mounted on the former component based on the acquired position information of the former component, is able to improve the mounting accuracy of a component when mounting multiple components in a stack on a board.

With a component mounter of the present disclosure, the controller may be configured to, when mounting the latter component, after lowering the holding member that is holding the latter component to a specified position, lower the holding member at a low speed until it is detected that the latter component has contacted the former component, and the specified position may be set based on the position information of the former component. Accordingly, when mounting a latter component, it is possible to soften the impact force applied to a former component.

Also, with a component mounter of the present disclosure, the contact detector may include a pressure detector configured to detect pressure applied to the holding member, and may be configured to detect that the component held by the holding tool has contacted the mounting target object by using the pressure detector to detect that the pressure is a specified value or greater.

Further, with a component mounter of the present disclosure,
the raising and lowering device may include
a first raising and lowering device configured to raise and lower the holding member within a specified range, and
a second raising and lowering device configured to raise and lower the holding member within a range shorter than the specified range and to be raisable and lowerable together with the holding tool via the first raising and lowering device.

A component mounting system of the present disclosure includes: a first component mounter configured to mount components on a board; and a second component mounter arranged downstream in a mounting line with respect to the first component mounter and configured to stack and mount a component on an upper surface of a component mounted by the first component mounter;
wherein
the first component mounter includes
a first head including a first holding member configured to hold the component,
a first raising and lowering device configured to raise and lower the first holding member,
a first raising and lowering position detector configured to detect a raising and lowering position of the first holding member, a first contact detector configured to detect that the component held by the first holding member has contacted a mounting target object, a first controller configured to control the first head and the first raising and lowering device such that a former component among the multiple components to be stacked on the board is mounted on the board, and a transmitting means configured to, when mounting the former component, transmit directly or indirectly to the second component mounter position information of the former component identified based on the raising and lowering position of the first holding member detected by the first raising and lowering position detector when the first contact detector detects that the former component has contacted the board, and the second component mounter includes a second head including a second holding member configured to hold the component, a second raising and lowering device configured to raise and lower the second holding member, a second raising and lowering position detector configured to detect a raising and lowering position of the second holding member, a receiving means configured to receive directly or indirectly the position information of the former component transmitted from the first component mounter, and a second controller configured to control the second head and the second raising and lowering device so as to mount a latter component among the multiple components to be stacked on the board on the former component based on the received position information of the former component.

With a component mounting system of the present disclosure, the first component mounter, when mounting a former component among multiple components to be stacked on board, identifies position information of the former component based on detection results of the first contact detector and the first raising and lowering position detector and sends the position information to the second component mounter. The second component mounter that is arranged downstream to the first component mounter in the mounting line, when mounting a latter component among the multiple components to be stacked on the board, mounts the latter component on the former component based on the position information of the former component received from the first component mounter. Therefore, when mounting and stacking multiple components on a board, mounting accuracy of components is improved.

DESCRIPTION OF EMBODIMENTS

An embodiment of the present disclosure is described below.

Figure 1:
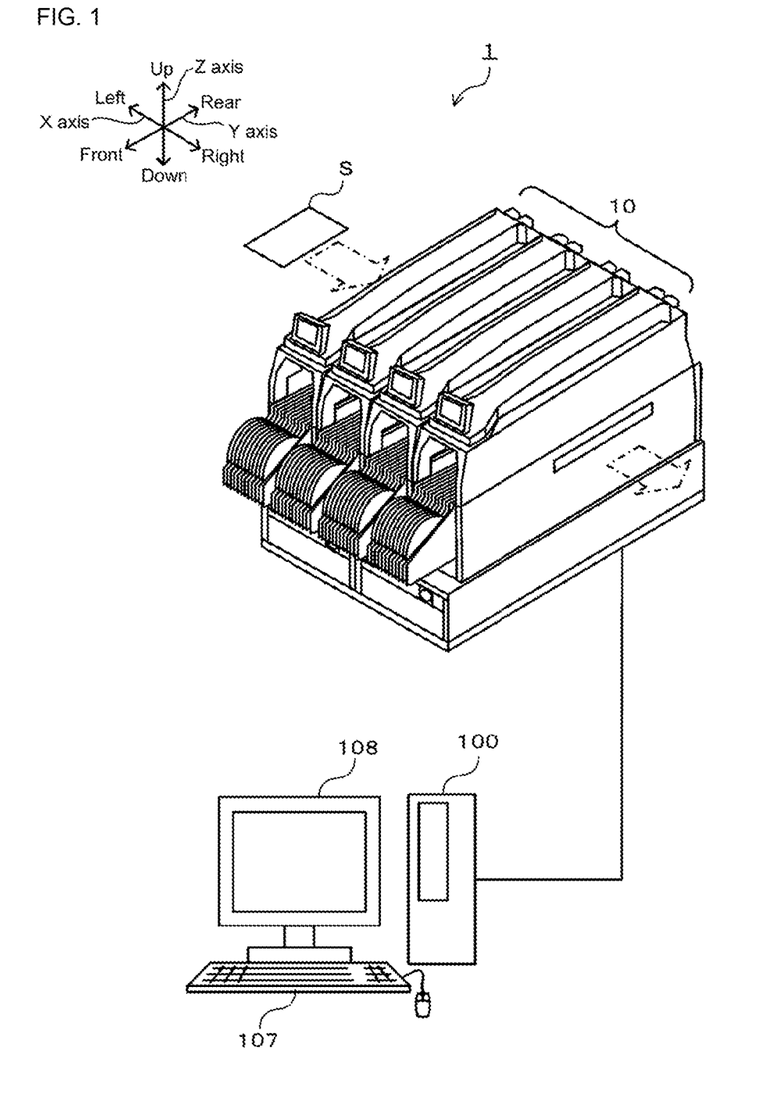
FIG. 1 shows an outline of the configuration of an embodiment, component mounting system 1.
Figure 2:
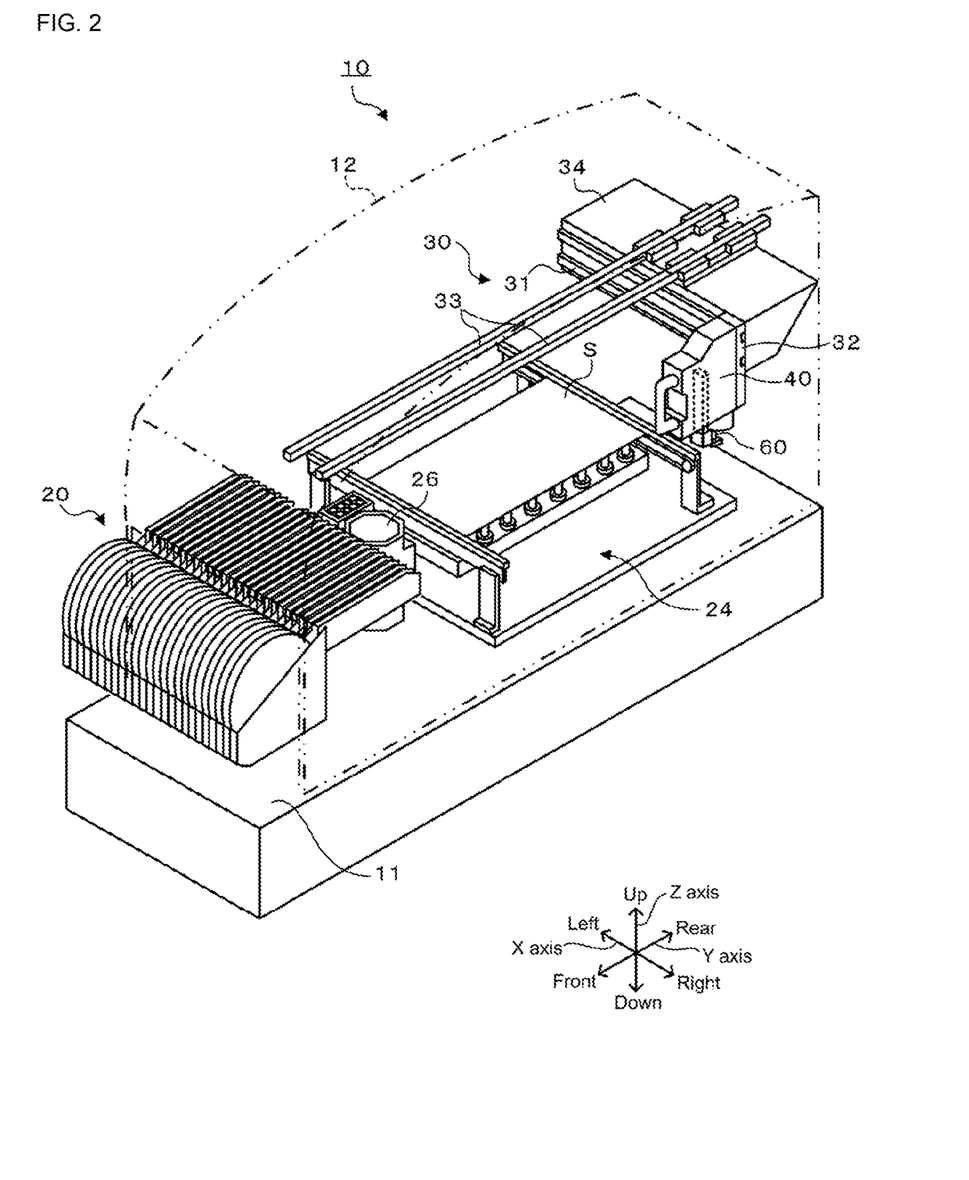
FIG. 2 shows an outline of the configuration of an embodiment, component mounter 10.
Figure 3:
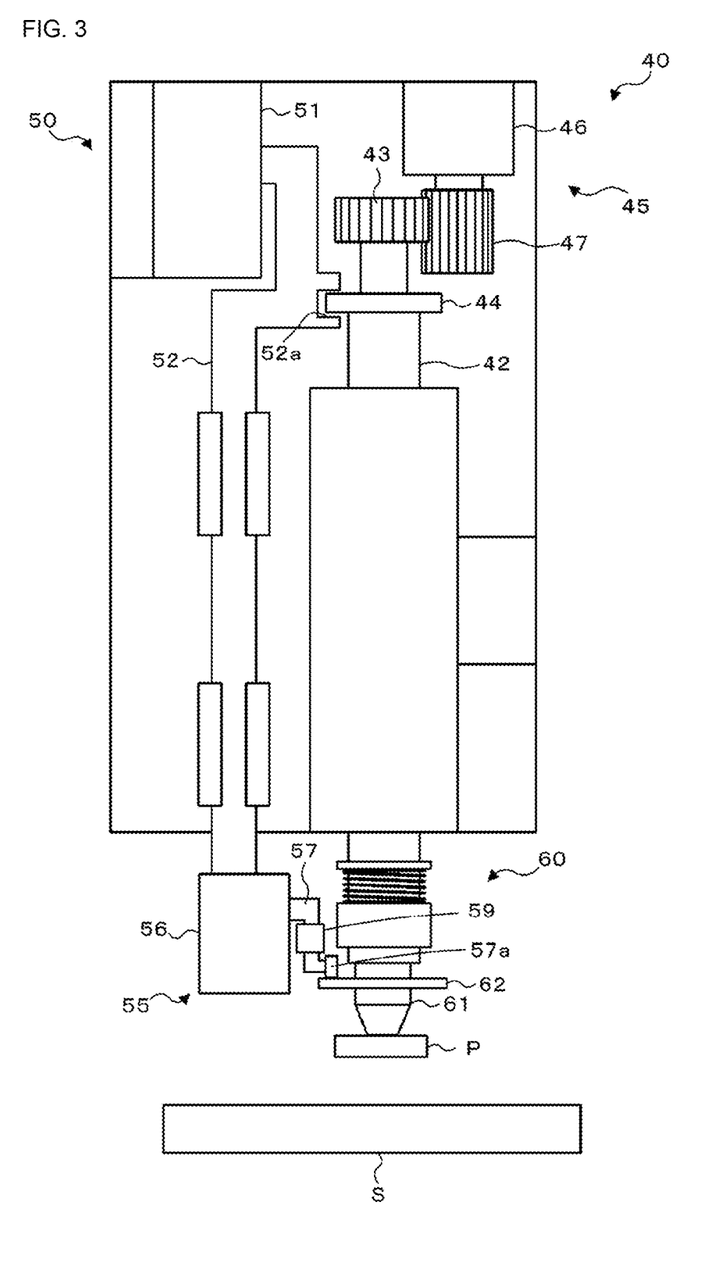
FIG. 3 shows an outline of the configuration of mounting head 40.
Figure 4:
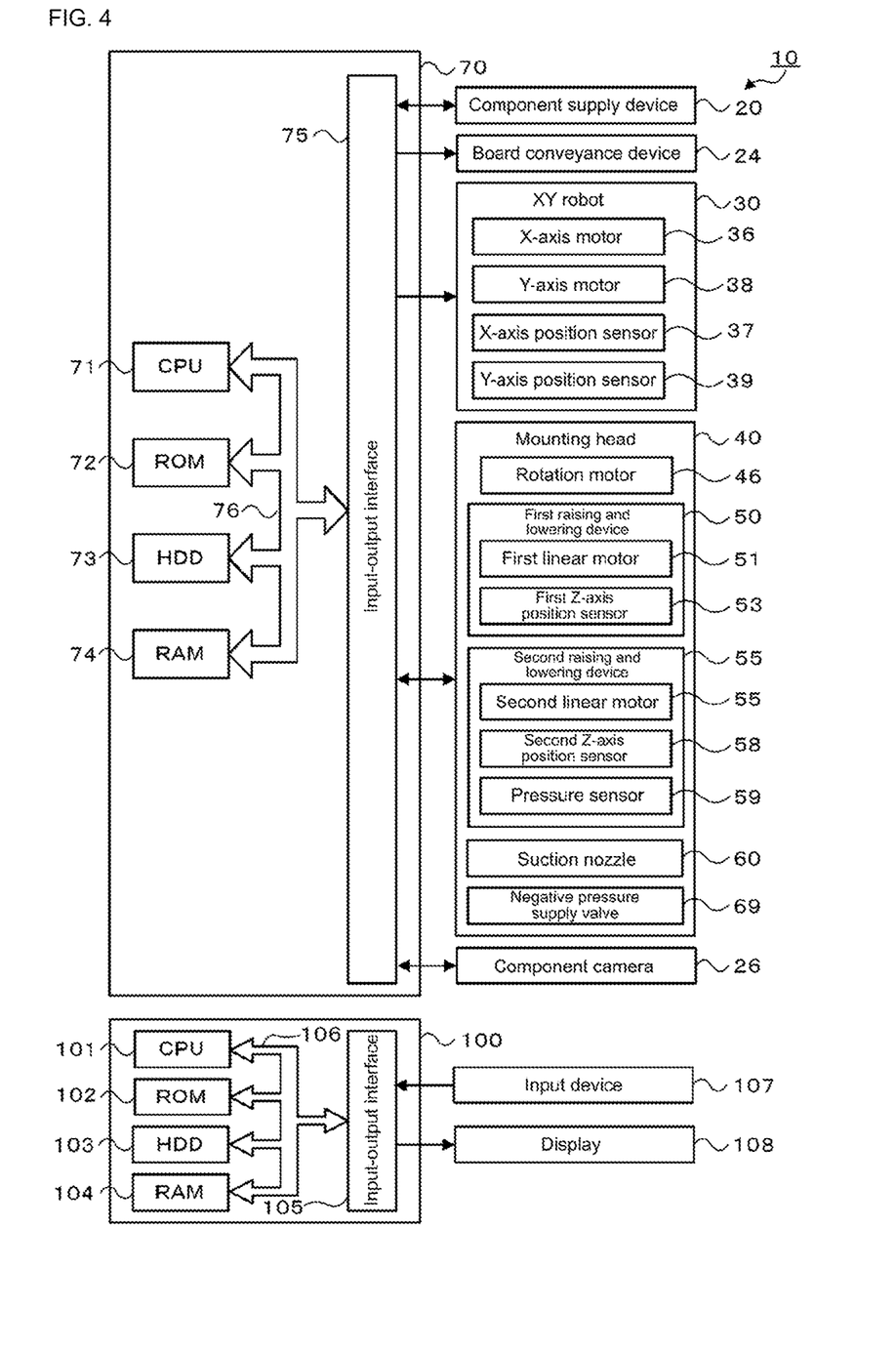
FIG. 4 shows an outline of the configuration of management device 100 and control device 70 of component mounter 10.

FIG. 1 shows an outline of the configuration of an embodiment, component mounting system 1; FIG. 2 shows an outline of the configuration of an embodiment, component mounter 10; FIG. 3 shows an outline of the configuration of mounting head 40; and FIG. 4 shows an outline of the configuration of management device 100 and control device 70 of component mounter 10. Note that, a left-right direction in FIGS. 1 and 2 is an X-axis direction, a front (near side)-rear (depth) direction is a Y-axis direction, and an up-down direction is a Z-axis direction.

As shown in FIG. 1, component mounting system 1 is provided with multiple component mounters 10 arranged in a line in the conveyance direction of board S to configure a component mounting line, and management device 100 that performs overall control of the system.

As shown in FIG. 2, viewed from the outside, component mounter 10 is configured from base 11 and frame 12 supported on base 11. As shown in FIG. 2, the configuration of component mounter 10 is provided with component supply device 20 that supplies component P to a component supply position, board conveying device 24 that conveys board S, mounting head 40 that picks up a component P supplied to the component supply position and mounts the component on board S, XY robot 30 that moves mounting head 40 in the XY axis directions, and control device 70 (refer to FIG. 3) that performs overall device control. Component mounter 10 is also provided with items such as component camera 26 for imaging the orientation of component P picked up by mounting head 40, and a mark camera (not shown) provided on mounting head 40 for reading positioning reference marks that are provided on board S.

Component supply device 20 is configured from tape feeders that supply components P to a component supply device by pitch feeding, from a reel, tape that houses components P in storage sections formed at regular intervals.

As shown in FIG. 2, XY robot 30 is provided with Y-axis guide rail 33 attached to an upper level of frame 12 extending in the front-rear direction (Y direction), Y-axis slider 34 that is able to slide along Y-axis guide rail 33 while being supported on Y-axis guide rail 33, X-axis guide rail 31 attached to a side surface of Y-axis slider 34 extending in the left-right direction (X direction), and X-axis slider 32 that is able to slide along X-axis guide rail 31. X-axis slider 32 is movable by the driving of X-axis motor 36 (refer to FIG. 4), and Y-axis slider 34 is movable by the driving of Y-axis motor 38 (refer to FIG. 4). Mounting head 40 is provided on X-axis slider 32, and control device 70 moves mounting head 40 to any position in an XY plane by performing drive control of XY robot 30 (X-axis motor 36 and Y-axis motor 38).

As shown in FIG. 3, mounting head 40 is provided with head main body 42 as a shaft member, suction nozzle 60 removably attached to a lower end of head main body 42, rotation device 45 that rotates head main body 42, first raising and lowering device 50 that raises and lowers suction nozzle 60 in the Z-axis direction via head main body 42, and second raising and lowering device 55 that raises and lowers suction nozzle 60 in the Z-axis direction.

Suction nozzle 60 is provided with suction section 61 that is capable of picking up component P by negative pressure being applied to a suction opening at the end of suction section 61 and the suction opening contacting against component P, and flange section 62 extending in a diameter direction at an upper section of suction section 61. Suction section 61 is connected to a negative pressure source, which is not shown, via negative pressure supply valve 69 (refer to FIG. 4), and by turning on negative pressure supply valve 69, negative pressure at the suction opening of suction section 61 is used to pick up component P, and, by turning off negative pressure supply valve 69, positive pressure at the suction opening of suction section 61 is used to release component P.

Rotation device 45 is provided with rotation motor 46 a rotating shaft of which is provided with gear 47. Gear 43 that engages with gear 47 is attached to an upper end of head main body 42, and by control device 70 performing drive control of rotation motor 46, head main body 42 can be adjusted to any rotation angle. As described above, because suction nozzle 60 is attached to an end of head main body 42, by control device 70 performing drive control of rotation motor 46, component P held by suction nozzle 60 can be adjusted to any rotation angle.

As shown in FIG. 3, first raising and lowering device 50 is provided with first linear motor 51, and first Z-axis slider 52 that can be raised and lowered in the Z-axis direction by the driving of first linear motor 51. First engaging member 52a that can engage with (contact) horizontal section 44 provided on head main body 42 is formed on first Z-axis slider 52. Therefore, head main body 42 can be raised and lowered in accordance with the raising and lowering of first Z-axis slider 52. Because suction nozzle 60 is attached to head main body 42, suction nozzle 60 can be raised and lowered in accordance with the raising and lowering of head main body 42.

As shown in FIG. 3, second raising and lowering device 55 is provided with second linear motor 56 attached to first Z-axis slider 52 of first raising and lowering device 50, and second Z-axis slider 57 that can be raised and lowered by the driving of second linear motor 56. Second engaging member 57a that can engage with (contact) an upper surface of flange section 62 of suction nozzle 60 is formed on second Z-axis slider 57. Therefore, suction nozzle 60 can be raised and lowered in accordance with the raising and lowering of second Z-axis slider 57. In the present embodiment, the stroke distance of second Z-axis slider 57 by second raising and lowering device 55 is shorter than the stroke distance of first Z-axis slider 52 by first raising and lowering device 50. Mounting head 40, after rough adjust of the Z-axis position of component P held by suction nozzle 60 by first raising and lowering device 50, can perform fine adjustment of the Z-axis position of component P using second raising and lowering device 55. Also, pressure sensor 59 for detecting pressure A (load) applied to suction nozzle 60 when component P contacts suction section 61 of suction nozzle 60 during pickup, and when component P held by suction nozzle 60 contacts board S during mounting is provided on second Z-axis slider 57.

As shown in FIG. 4, control device 70 is provided with CPU 71, ROM 72, HDD 73, RAM 74, and input-output interface 75. These items are electrically connected by bus 76. Image signals from component camera 26, image signals from the mark camera, detection signals from X-axis position sensor 37 for detecting the position of X-axis slider 32 in the X-axis direction, detection signals of Y-axis position sensor 39 for detecting the position of Y-axis slider 34 in the Y-axis direction, detection signals of first Z-axis position sensor 53 for detecting the position of first Z-axis slider 52 in the Z-axis direction, detection signals of second Z-axis position sensor 58 for detecting the position of second Z-axis slider 57 in the Z-axis direction, and so on enter control device 70 via input-output interface 75. On the other hand, control signals for component supply device 20, control signals for board conveyance device 24, drive signals for XY robot 30 (X-axis motor 36 and Y-axis motor 38), drive signals for mounting head 40 (rotation motor 46, first linear motor 51, second linear motor 56, negative pressure supply valve 69, and so on), and so on are output from control device 70 via an output board. Also, control device 70 is connected to management device 100 such that two-way communication is possible, and they perform communication of data and control signals with each other.

Management device 100, for example, is a general purpose computer provided with, as shown in FIG. 4, items such as CPU 101, ROM 102, HDD 103, RAM 104, and input-output interface 105. These items are electrically connected by bus 106. Management computer 100 receives input signals from input device 107 such as a mouse or keyboard via input-output interface 105. Also, management device 100 outputs image signals to display 108 via input-output interface 105. HDD 103 memorizes a production plan of board S. Here, the board production plan is a plan that defines which components should be mounted on the board and in what order by component mounter 10, along with how many boards S mounted with components P in this manner are to be manufactured, and so on. Included in the production plan are items such as board data related to the board S to be produced, head data related to the mounting heads 40 to be used, nozzle data related to the suction nozzles 60 to be used, component data related to the components P to be used, and target mounting positions of each component P. Management device 100 creates a production plan based on data entered by an operator via input device 107, and sends the created production plan to each component mounter 10.

Figure 5:
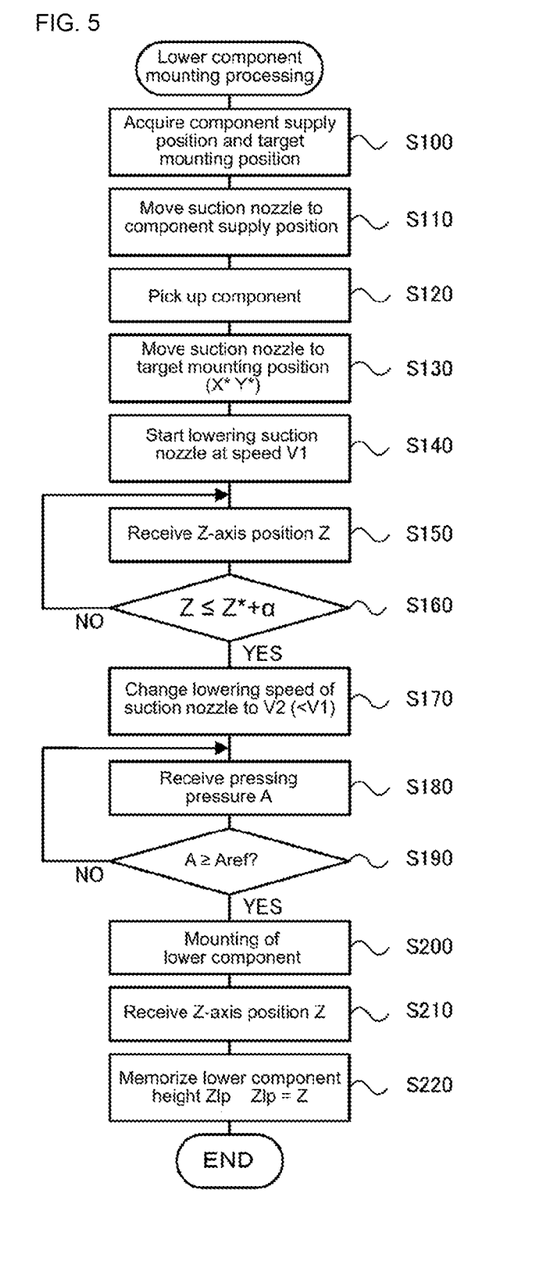
FIG. 5 is a flowchart showing an example of lower component mounting processing performed by CPU 71 of control device 70.

Described next are operations of component mounter 10 of the present embodiment configured as above, in particular, operations in a case in which PoP (package-on-package) mounting is performed in which an upper component PU is mounted and stacked on an upper surface of lower component PL that has been mounted on board S. First, processing when mounting lower component PL on board S is described (lower component mounting processing), then processing when mounting upper component PU on lower component PL is described (upper component mounting processing). FIG. 5 is a flowchart showing an example of a lower component mounting process that is performed by CPU 71 of control device 70. This processing is performed when a mounting command is issued from management device 100. Note that, a mounting command includes items such as component information related to component P (such as size and type of component P), component supply position (Xs, Ys, and Zs) of component P supplied by component supply device 20, and target mounting positions (X*, Y*, and Z*) of component P.

When lower component mounting processing is performed, CPU 71 of control device 70 acquires the component supply position (Xs, Ys, and Zs), and the target mounting position (X*, Y*, and Z*) (S100). Then, CPU 71 performs drive control of XY robot 30 (X-axis motor 36 and Y-axis motor 38) such that the position of suction nozzle 60 in the XY directions matches the XY coordinates (Xs, Ys) of the component supply position, performs drive control of first raising and lowering device 50 (first linear motor 51) and second raising and lowering device 55 (second linear motor 56) such that the position of suction nozzle 60 in the Z direction matches the Z coordinate (Zs) of the component supply position (S110), and turns on negative pressure supply valve such that suction nozzle 60 picks up component P (S120). Note that, in processing of S110, CPU 71 may perform drive control of first raising and lowering device 50 (first linear motor 51) and second raising and lowering device 55 (second linear motor 56), so as to lower suction nozzle 60, until it is detected by pressure sensor 59 that suction nozzle 60 has contacted component P at the component supply position.

Then, CPU 71, after performing drive control of XY robot 30 such that the XY-direction position of suction nozzle 60 (component P) matches the XY coordinates (X*, Y*) of the target mounting position (S130), performs drive control of first raising and lowering 50 (first linear motor 51) so as to lower suction nozzle 60 at speed V1 (S140). Here, speed V1 is predetermined as a relatively high speed so as to shorten the time required for mounting lower component PL. Then, CPU 71 receives the Z-axis position Z of the suction nozzle tip identified based on detection signals of first Z-axis position sensor 53 and second Z-axis position sensor 58 (S150), and determines whether the received Z-axis position has reached a specified position (Z*+α) that is distance a above the Z coordinate (Z*) of the target mounting position (S160). CPU 71, if determining that the Z-axis position has reached the specified position (Z*+α), performs drive control of second raising and lowering device 55 (second linear motor 56) such that suction nozzle 60 is further lowered at speed V2 (S170). Here, speed V2 is a predetermined relatively slow speed for softening the impact when lower component PL contacts board S.

Then, CPU 71 receives pressing pressure A from pressure sensor 59 (S180), and waits for the received pressing pressure A to reach at least specified pressure value Aref (S190). Here, specified pressure value Aref is a threshold used for determining whether lower component PL has contacted board S. CPU 71, when determining that pressing pressure A has reached at least specified pressure value Aref, that is, determining that lower component PL has contacted board S, turns negative pressure supply valve off, and mounts lower component PL on board S by applying positive pressure to suction nozzle 60 (S200). Then, CPU 71, in a state with lower component PL contacting board S, receives the Z-axis position Z of the suction nozzle tip identified based on detection signals from first Z-axis position sensor 53 and second Z-axis position sensor 58 (S210), memorizes the received Z-axis position Z as lower component height Zlp in RAM 74 (S220), and ends lower component mounting processing.

Figure 6:
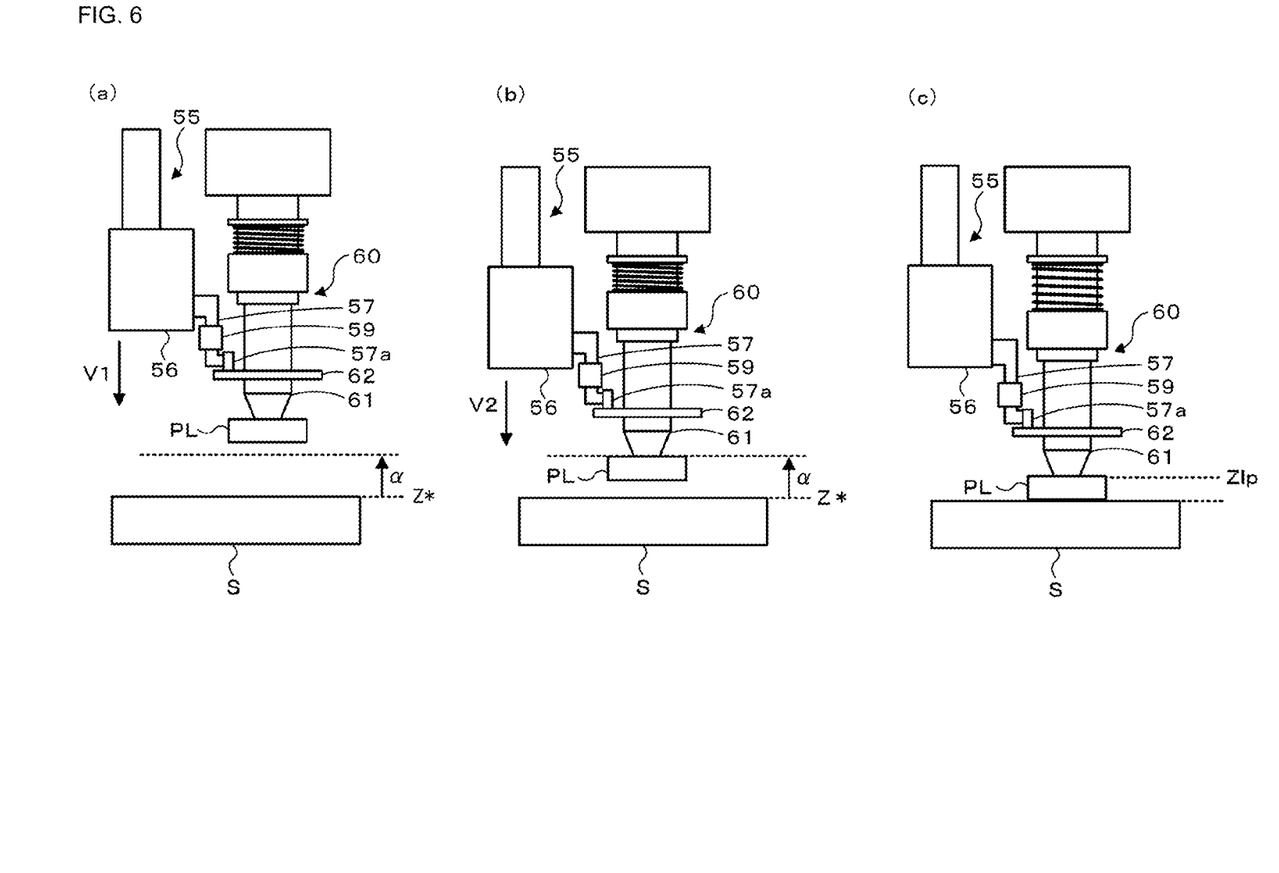
FIG. 6 shows a state when mounting lower component PL on board S.

FIG. 6 shows a state when mounting lower component PL on board S. As shown, component mounter 10 lowers lower component PL at relatively high speed V1 using first raising and lowering device 50 until lower component PL reaches a specified position (Z*+α) that is a specified distance a from the Z coordinate (Z*) of the target mounting position of board S (refer to FIG. 6[a]), and lowers lower component PL at speed V2 that is slower than V1 using second raising and lowering device 55 until contact with board S is detected. By this, it is possible to prevent damage to lower component PL and board S by softening the impact when lower component PL contacts board S while reducing the time required for mounting lower component PL on board S. Also, the Z-axis position Z of the suction nozzle tip when lower component PL contacts board S is memorized on RAM 74 as the height of the upper surface of lower component PL (lower component height Zlp). This lower component height Zlp is used when performing PoP mounting of upper component PU on lower component PL.

Figure 7:
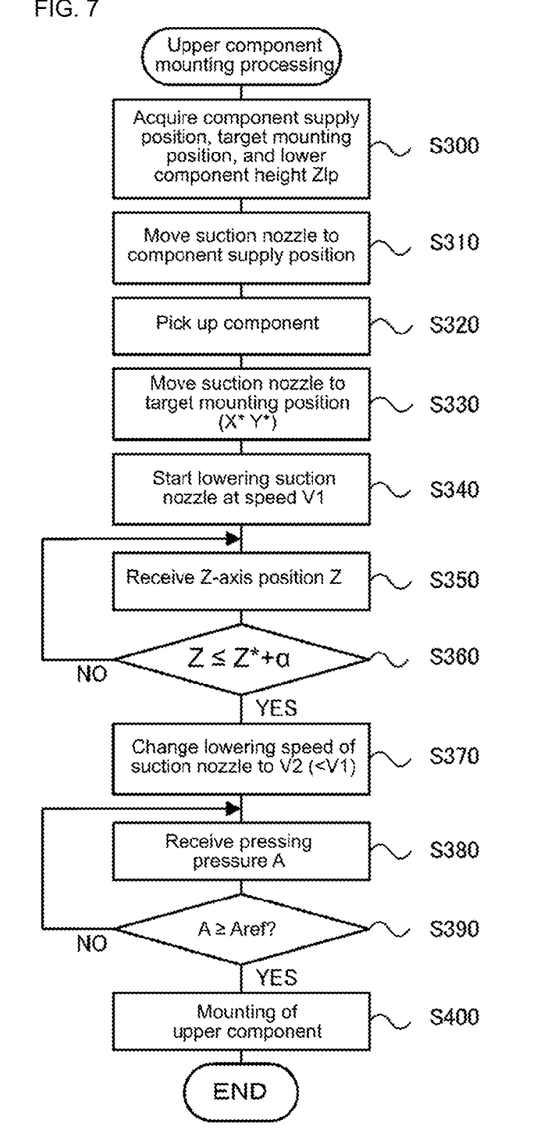
FIG. 7 is a flowchart showing an example of upper component mounting processing performed by CPU 71 of control device 70.

Next, upper component mounting processing is described. FIG. 7 is a flowchart showing an example of an upper component mounting process that is performed by CPU 71 of control device 70. When upper component mounting processing is performed, CPU 71 of control device 70 acquires the component supply position (Xs, Ys, and Zs), the target mounting position (X*, Y*, and Z*), and lower component height Zlp memorized in RAM 74 in S220 (S300). Then, CPU 71 moves suction nozzle 60 to the component supply position, and picks up upper component PU with suction nozzle 60 (S310, S320).

Next, CPU 71, after matching the XY-axis direction of suction nozzle 60 with the XY coordinates (X*, Y*) of the target mounting position (S330), lowers suction nozzle 60 using first raising and lowering device 50 at speed V1 (S340). Then, CPU 71 receives the Z-axis position Z of the suction nozzle tip (S350), and determines whether the received Z-axis position Z has reached the specified position (Zlp+α) that is distance a above lower component height Zlp acquired in S300 (S360). CPU 71, if determining that the Z-axis position Z has reached the specified position (Zlp+α), further lowers suction nozzle 60 at speed V2 that is slower than speed V1 using second raising and lowering device 55 (S370). Details of speeds V1 and V2 were given above.

Then, CPU 71 receives pressing pressure A from pressure sensor 59 (S380), and waits for the received pressing pressure A to reach at least specified pressure value Aref (S390). CPU 71, when determining that pressing pressure A has reached at least specified pressure value Aref, that is, determining that upper component PU has contacted lower component PL, turns negative pressure supply valve off, and mounts upper component PU on lower component PL (S400), then ends upper component mounting processing.

Figure 8:
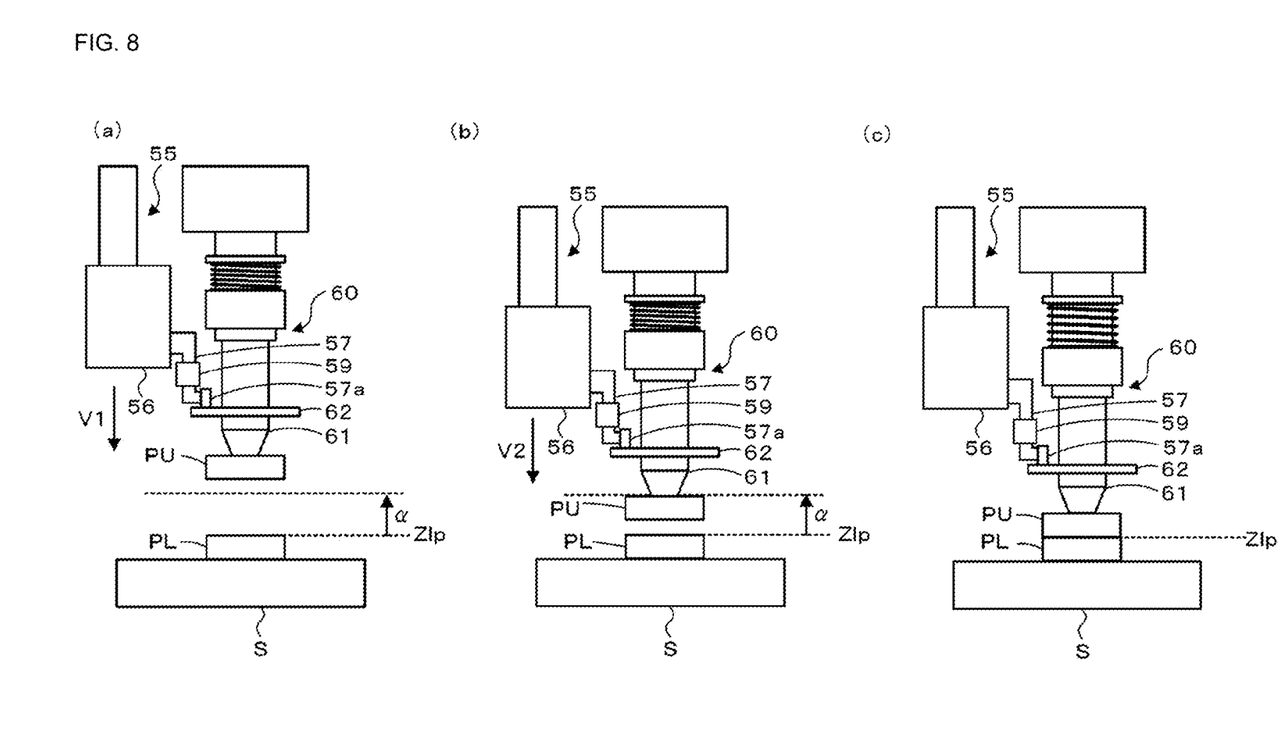
FIG. 8 shows a state when mounting upper component PU on lower component PL (PoP mounting).

FIG. 8 shows a state when mounting upper component PU on lower component PL. As shown, component mounter 10 lowers upper component PU at relatively high speed V1 using first raising and lowering device 50 until upper component PU reaches a specified position (Zlp+α) that is a specified distance a from the Z coordinate (Z*) of the upper surface of lower component PL (refer to FIG. 8[a]), and, after reaching the specified position (Zlp+α), lowers upper component PU at speed V2 that is slower than V1 using second raising and lowering device 55 until contact with the upper surface of lower component PL is detected. By this, it is possible to prevent damage to upper component PU and lower component PL by softening the impact when upper component PU contacts lower component PL while reducing the time required for mounting upper component PL on board S. As described above, lower component height Zlp is Z-axis position Z of the suction nozzle tip detected by first Z-axis position sensor 53 and second Z-axis position sensor 58 when lower component PL contacts board S when lower component PL is mounted on board S, therefore, it is possible to accurately mount upper component PU on lower component PL even if warpage occurs with board S or there are dimension errors in lower component PL or board S.

Correspondences between main constituent elements of the embodiments and main constituent elements of the disclosure will be clarified here. That is, mounting head 40 corresponds to a "head", first raising and lowering device 50 and second raising and lowering device 55 correspond to a "raising and lowering device", first Z-axis position sensor 53 and second Z-axis position sensor 58 correspond to a "raising and lowering position detector", pressure sensor 59 corresponds to a "contact detector", and CPU 71 of control device 70 that performs lower component mounting processing of FIG. 5 and upper component mounting processing of FIG. 7 corresponds to a "controller". Also, pressure sensor 59 corresponds to a "pressure detector". Further, first raising and lowering device 50 corresponds to a "first raising and lowering device", and second raising and lowering device 55 corresponds to a "second raising and lowering device".

Component mounter 10 of an embodiment described above, when performing PoP mounting of mounting an upper component PU on a lower component PL after mounting the lower component PL on board S, detects Z-axis position Z of the suction nozzle tip when mounting lower component PL on board S and memorizes the position as lower component height Zlp, and then performs mounting of upper component PU using the memorized lower component height Zlp. Therefore, even if board S is warped or if there are dimension errors with board S or lower component PL, it is possible to mount upper component PU on lower component PL more accurately.

Also, component mounter 10, when mounting upper component PU, lowers suction nozzle 60 (upper component PU) at relatively high speed V1 until reaching specified position (Zlp+α) that is distance a above lower component height Zlp, and lowers suction nozzle 60 at speed V2 that is slower than speed V1 after arriving at the specified position (Zlp+α) until contact with lower component PL. By this, it is possible to prevent damage to upper component PU and lower component PL by softening the impact when upper component PU contacts lower component PL while reducing the time required for mounting upper component PL on board S.

Meanwhile, it goes without saying that the disclosure is not limited to the above-mentioned embodiment and various embodiments may be applied within the technical scope of the disclosure.

For example, in an embodiment above, lower component mounting processing and upper component mounting processing are performed by the same component mounter 10, but lower component mounting processing may be performed at a component mounter (first component mounter) at an upstream point of a component mounting line, and upper component mounting processing may be performed by a component mounter (second component mounter) at a downstream point of the component mounting line. In this case, with lower component mounting processing, instead of processing of S220 of FIG. 5, processing of sending lower component height Zlp to management device 100 is performed, and with upper component mounting processing, during processing of S300 of FIG. 7, processing of receiving lower component height Zlp from management device 100 is performed. Note that, lower component height Zlp may be sent directly from the first component mounter to the second component mounter.

Figure 9:
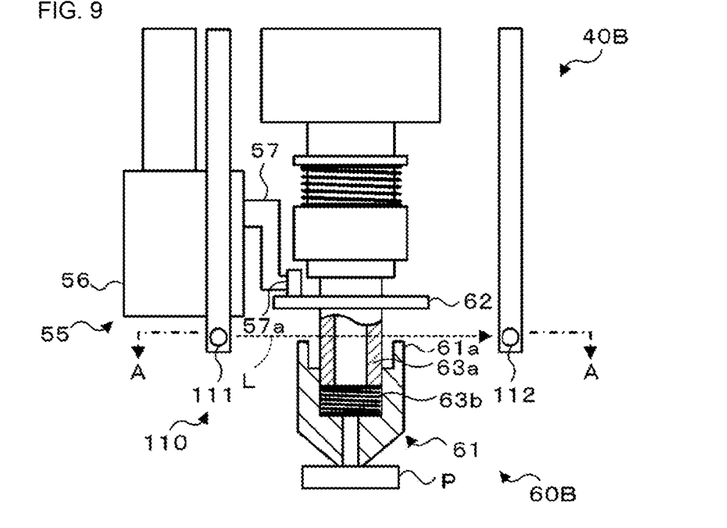
FIG. 9 is a cross section of a portion of mounting head 40B that is an alternative embodiment.
Figure 10:
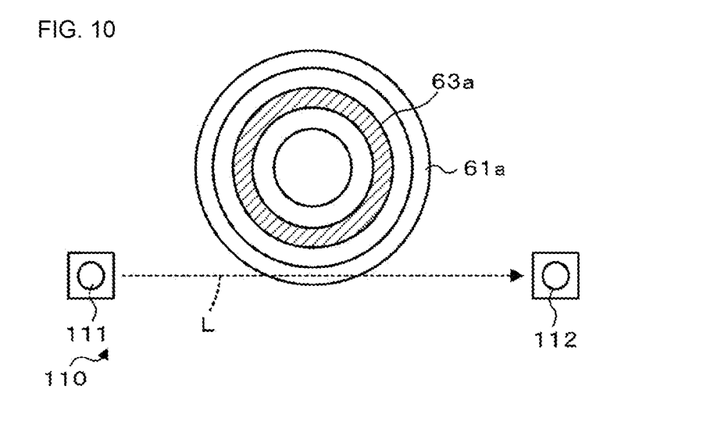
FIG. 10 is a cross section at line A-A in FIG. 9.

Also, in an embodiment above, an item (component P) contacting suction nozzle 60 is detected using pressure sensor 59 provided on second Z-axis slider 57, but the configuration is not limited to this so long as detection of the item contacting suction nozzle 60 is possible. For example, a touch sensor may be used, or control device 70 may detect contact based on a large increase in the load current of the second linear motor 56 such that a sensor can be omitted. Also, the configuration may be such that multiple members that configure a suction nozzle move relatively when the suction nozzle contacts another item during lowering, and contact may be detected by whether this relative movement has occurred. FIG. 9 is a cross section of a portion of mounting head 40B that is an alternative embodiment of such a case. FIG. 10 is a cross section of line A-A in FIG. 9. Mounting head 40B of an alternative embodiment is provided with optical sensor 110 instead of pressure sensor 59 provided on second raising and lowering device 55. Also, suction nozzle 60B is provided with blocking section 61a, tube section 63a, and spring 63b. Tube section 63a is raised and lowered in a vertical direction in accordance with the driving of first raising and lowering device 50 or second raising and lowering device 55. Suction section 61 is a cylindrical member connected to tube section 63a via spring 63b, and the tip (lower end) thereof is able to pick up component P. An internal circumferential surface of suction section 61 contacts an outer circumferential surface of tube section 63a, and is slidable vertically relative to tube section 63a. Also, cylindrical blocking section is provided on an upper end of suction section 61. Optical sensor 110 is configured as a sensor provided with light emitter 111 and light receiver 112. With mounting head 40B, in a state in which another item is not contacting the lower end of suction section 61, the relative positions of tube section 63a and suction section 61 are maintained by elastic force of spring 63b, and light axis L emitted from light emitter 111 to light receiver 112 is not blocked. On the other hand, if suction nozzle 60B is lowered such that another item contacts the lower end of suction section 61, suction section 61 moves up relative to tube section 63a, and light axis L is blocked by blocking section 61a. Therefore, control device 70 is able to detect that suction nozzle 60B has contacted another item by the fact that light receiver 112 no longer receives the light axis from light emitter 111. In this case too, where the relative vertical movement of multiple members that configure the suction nozzle is detected, similar to an embodiment above, it is possible to detect contact with a component when the suction nozzle is lowered. Note that, the sensor for performing detection of relative movement of multiple members that configure a suction nozzle is not limited to the example of FIGS. 9 and 10. For example, a light emitter and light receiver may be provided at a lower section of flange 62, with light from the light receiver being reflected by the upper surface of blocking section 61a, and that relative movement of flange 62 and blocking section 61a is detected by the light receiver receiving reflect light.

Also, in an embodiment above, two raising and lowering devices (first raising and lowering device 50 and second raising and lowering device 55) are provided as raising and lowering devices for raising and lowering a component, but the configuration is not limited to this, and one raising and lowering device may be provided, or three or more raising and lowering devices may be provided.

INDUSTRIAL APPLICABILITY

The present disclosure may be applied to the industrial field of component mounters and the like.

REFERENCE SIGNS LIST

1: component mounting system; 10: component mounter, 11: base; 12: frame; 20: component supply device; 24: board conveyance device; 26: component camera; 30: XY robot; 31: X-axis guide rail; 32: X-axis slider, 33: Y-axis guide rail; 34: Y-axis slider, 36: X-axis motor, 37: X-axis position sensor, 38: Y-axis motor; 39: Y-axis position sensor; 40, 40B: mounting head; 42: head main body; 43: gear; 44: horizontal section; 45: rotation device; 46: rotation motor; 47: gear, 50: first raising and lowering device; 51: first linear motor, 52: first Z-axis slider, 52a: first engaging section; 53: first Z-axis position sensor, 55: second raising and lowering device; 56: second linear motor; 57: second Z-axis slider, 57a: second engaging section; 58: second Z-axis position sensor; 59: pressure sensor; 60, 60B: suction nozzle; 61: suction section; 62: flange section; 63a: tube section; 63b: spring: 69: negative pressure supply valve; 70: control section; 71: CPU; 72: ROM; 73: HDD; 74: RAM; 75: input-output interface; 76: bus; 100: management device; 101: CPU; 102: ROM; 103: HDD; 104: RAM; 105: input-output interface; 106: bus; 107: input device; 108: display; 110: optical sensor, 111: light emitter, 112: light receiver, P: component; S: board

The invention claimed is:

1. A component mounter for mounting multiple components in a stack on a board, the component mounter comprising:
   a head including a nozzle configured to hold a component of the multiple components;
   a raising and lowering device configured to raise and lower the nozzle, the raising and lowering device including at least one motor;
   a raising and lowering position sensor configured to detect a raising and lowering position of the nozzle;
   a contact sensor configured to detect that the component held by the nozzle has contacted a mounting target object; and
   a controller configured to
      control the head and the raising and lowering device to lower a first component among the multiple components to the board,
      acquire position information of the first component identified based on the raising and lowering position of the nozzle detected by the raising and lowering position sensor when the contact sensor determines that the first component contacts the board, and
      control the head and the raising and lowering device so as to, when mounting a second component among the multiple components to be stacked on the board, mount the second component on the first component based on the position information of the first component.

2. The component mounter according to claim 1, wherein the controller is configured to, when mounting the second component, after lowering the nozzle that is holding the second component to a specified position, lower the nozzle at a low speed until it is detected that the second component has contacted the first component, and
   the specified position is set based on the position information of the first component.

3. The component mounter according to claim 1, wherein the contact sensor includes a pressure sensor configured to detect pressure applied to the nozzle, and is configured to detect that the component held by the nozzle has contacted the mounting target object by using the pressure sensor to detect that the pressure is a specified value or greater.

4. The component mounter according to claim 1, wherein the raising and lowering device includes
   a first raising and lowering device configured to raise and lower the nozzle within a specified range, and
   a second raising and lowering device configured to raise and lower the nozzle within a range shorter than the specified range and to be raisable and lowerable together with the nozzle via the first raising and lowering device.

* * * * *